US009954001B2

(12) United States Patent
Peng et al.

(10) Patent No.: US 9,954,001 B2
(45) Date of Patent: Apr. 24, 2018

(54) STRUCTURE FOR INTERCONNECT PARASITIC EXTRACTION

(71) Applicants: Xingwei Peng, Shanghai (CN); Wei Wang, Shanghai (CN)

(72) Inventors: Xingwei Peng, Shanghai (CN); Wei Wang, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 15/241,108

(22) Filed: Aug. 19, 2016

(65) Prior Publication Data
US 2017/0053936 A1   Feb. 23, 2017

(30) Foreign Application Priority Data
Aug. 20, 2015   (CN) .......................... 2015 1 0514462

(51) Int. Cl.
| | |
|---|---|
| *H01L 27/118* | (2006.01) |
| *H01L 21/66* | (2006.01) |
| *H01L 27/11582* | (2017.01) |
| *H01L 49/02* | (2006.01) |
| *H01L 27/092* | (2006.01) |

(52) U.S. Cl.
CPC ........ *H01L 27/11807* (2013.01); *H01L 22/34* (2013.01); *H01L 27/11582* (2013.01); *H01L 28/00* (2013.01); *H01L 27/092* (2013.01); *H01L 2027/1187* (2013.01); *H01L 2027/11825* (2013.01); *H01L 2027/11875* (2013.01); *H01L 2027/11881* (2013.01)

(58) Field of Classification Search
CPC ................................................. H01L 27/11807
USPC ............................................................ 331/57
See application file for complete search history.

(56) References Cited

U.S. PATENT DOCUMENTS

| | | | | |
|---|---|---|---|---|
| 5,811,983 | A * | 9/1998 | Lundberg ........... | G01R 31/2882 324/750.3 |
| 6,133,799 | A * | 10/2000 | Favors, Jr. .......... | H01L 27/1203 257/E27.112 |
| 6,463,570 | B1 * | 10/2002 | Dunn ..................... | H01L 22/14 257/E21.531 |
| 2003/0122627 | A1 * | 7/2003 | Takahashi ............ | H03K 3/0315 331/57 |

* cited by examiner

*Primary Examiner* — Joseph Chang
(74) *Attorney, Agent, or Firm* — Tianchen LLC (57) ABSTRACT

A structure for extracting interconnect parasitic in a ring oscillator is disclosed. The ring oscillator comprises multiple logical units connected in head to tail series. The structure comprises parasitic resistance sub-structures and/or parasitic capacitance sub-structures each connected to a corresponding logical unit. The structure can be used to determine errors in extracting parasitic resistance of polysilicon interconnects and metal interconnects, and/or errors in extracting parasitic capacitance between the polysilicon interconnects and between the metal interconnects. Therefore, the parasitic extraction error can be calibrated accordingly to obtain more precise circuit simulation results and more accurate device model and BEOL model.

14 Claims, 5 Drawing Sheets

FIG. 1

--Prior Art--

FIG. 2

--Prior Art—

STRUCTURE FOR INTERCONNECT PARASITIC EXTRACTION

CROSS-REFERENCE TO RELATED APPLICATION

This application claims the priority benefit of China patent application serial No. 201510514462.X filed Aug. 20, 2015. The entirety of each of the above-mentioned patent applications is hereby incorporated by reference herein and made a part of this specification.

FIELD OF THE INVENTION

The present invention relates to the field of integrated circuit technology, and more particularly, to a structure of extracting interconnect parasitic.

BACKGROUND OF THE INVENTION

Figure 1:
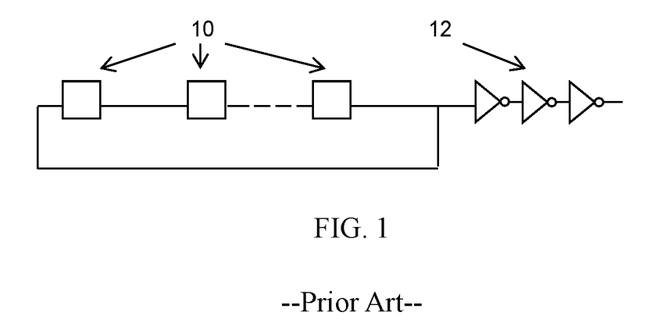
FIG. 1 is a circuit diagram of a conventional simulation structure for a logic circuit (a ring oscillator).

FIG. 1 is a conventional simulation structure for a logic circuit such as a ring oscillator. As shown in FIG. 1, the simulation structure comprises odd numbered (usually more than three) logical units 10 connected to each other in head-to-tail series. In FIG. 1, three logical units 10 form a ring oscillator. The output port of one of the logical units is electrically connected with the input port of at least one frequency divider 12. The logical unit can be an inverter, a NAND gate, or a NOR gate.

Figure 2:
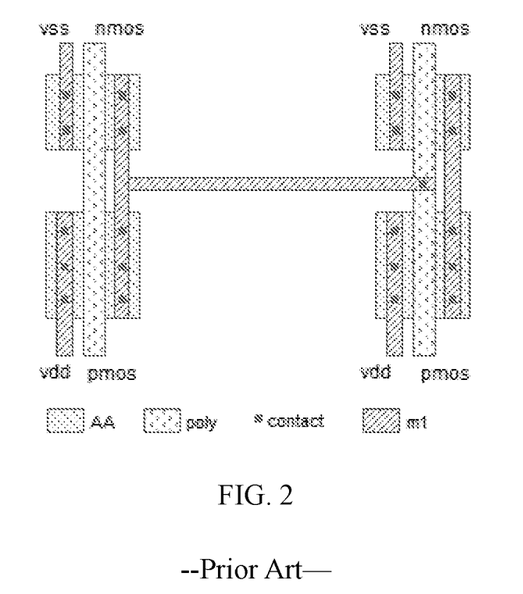
FIG. 2 is a top view illustrating the connection relationship between two logical units in the conventional simulation structure for a logic circuit.

Referring to FIG. 2, which is a top view of two adjacent logical units, each of the two logical units 10 comprises a PMOS transistor and a NMOS transistor. Defined herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. The output port of one logical unit is directly connected to the input port of the other logical unit through a metal connection line in the metal interconnect layer M1.

It is well known to those skilled in the art that actual ring oscillator circuit design is based on simulation results of the simulation structure. However, there exist errors between the simulation results and the actual measurement results, which affects the subsequent circuit design. Such errors are mainly caused by inaccurate device model and improper back-end-of-line (BEOL) interconnect parasitic extraction.

Nowadays, it is difficult to determine whether the errors between the simulation results and the actual measurement results are primarily caused by errors in device module or errors in BEOL interconnect parasitic extraction. Conventionally, the errors in the simulation results are compensated by adjusting a capacitance value in the device model, assuming the errors in the BEOL interconnect parasitic extraction to be zero. Such compensation method fails to determine the actual cause of the simulation error, which may result in both inaccurate device model and inaccurate BEOL model. Accordingly, logical circuit design based on these inaccurate models will not meet expectation.

From above, determination of device model error or BEOL interconnect parasitic extraction error is the key to reduce circuit simulation errors, and is a pressing problem to be solved.

BRIEF SUMMARY OF THE DISCLOSURE

The main object of the present invention is to overcome the defect of the conventional technology, and provides a structure for extracting interconnect parasitic in a ring oscillator, by which the errors in the BEOL interconnect parasitic extraction can be determined and then calibrated accordingly to obtain accurate device model and BEOL model, so as to increase the precision of the simulation results and affiliate the subsequent circuit design to meet the expectation.

To achieve the above objects, the present invention provides a structure for extracting interconnect parasitic in a ring oscillator. The ring oscillator comprises N logical units connected in head to tail series, wherein N is an odd number and is greater than or equal to 3. The structure comprises parasitic resistance sub-structures and/or parasitic capacitance sub-structures each connected to a corresponding logical unit for determining errors in extracting parasitic resistance of polysilicon interconnects and metal interconnects and/or errors in extracting parasitic capacitance between the polysilicon interconnects and between the metal interconnects.

Preferably, the logical units are selected from at least one of an inverter, a NAND gate, and a NOR gate.

Preferably, the parasitic resistance sub-structure is a polysilicon resistance cell having a serpentine shape connected between two adjacent logical units for determining errors in extracting the parasitic resistance of the polysilicon interconnects.

Preferably, the parasitic capacitance sub-structure is a polysilicon capacitance cell having a comb shape with one end connected to an input of the corresponding logical unit and the other end connected to a reference voltage for determining errors in extracting a polysilicon-to-substrate parasitic capacitance.

Preferably, the parasitic capacitance sub-structure is an interdigitated polysilicon capacitance cell with one end connected to an input of the corresponding logical unit and the other end connected to a reference voltage for determining errors in extracting the parasitic capacitance between the polysilicon interconnects.

Preferably, the parasitic resistance sub-structure is a metal resistance cell having a serpentine shape connected between two adjacent logical units for determining errors in extracting the parasitic resistance of the metal interconnects; wherein the metal resistance cell is disposed in any layer of multi-layer metal interconnects.

Preferably, the parasitic capacitance sub-structure is a metal capacitance cell having a comb shape with one end connected to an input of the corresponding logical unit and the other end connected to a reference voltage for determining errors in extracting a metal-to-substrate parasitic capacitance.

Preferably, the metal capacitance cell having a comb shape is disposed in any layer or any multiple layers of multi-layer metal interconnects.

Preferably, the parasitic capacitance sub-structure is an interdigitated metal capacitance cell with one end connected to an input of the corresponding logical unit and the other end connected to a reference voltage for determining errors in extracting the parasitic capacitance between the metal interconnects in the same metal layer. An anode and an cathode of the interdigitated metal capacitance cell are in the same metal layer.

Preferably, the interdigitated metal capacitance cell is disposed in any layer of multi-layer metal interconnects.

Preferably, the parasitic capacitance sub-structure is a two-layer orthogonal metal capacitance cell in two adjacent metal layers with one end connected to an input of the corresponding logical unit and the other end connected to a reference voltage for determining errors in extracting the parasitic capacitance between the metal interconnects in adjacent metal layers. An anode and an cathode of the two-layer orthogonal metal capacitance cell are disposed in two adjacent layers.

Preferably, a metal silicide layer is covered on the polysilicon resistance cell and/or the polysilicon capacitance cell.

According to the structure mentioned above, it can be determined which interconnect parasitic extraction causes the simulation error by comparing the simulation results with the actual measurement results, and thus the extraction error can be calibrated accordingly to obtain more precise circuit simulation results and more accurate device model and BEOL model. Therefore, risks on circuit re-design is greatly reduced.

DETAILED DESCRIPTION OF THE EMBODIMENTS

To understand the present invention more clearly and easily, the present invention will now be descried more fully hereinafter with reference to the accompanying drawings. The present invention shall not be limited to the embodiments set forth herein. General substitution known by the technical personnel in the art is within the protection scope of the present invention. It is noted that In the following discussion and in the claims, the term "connect" as used encompasses both direct and indirect connections.

Figure 3:
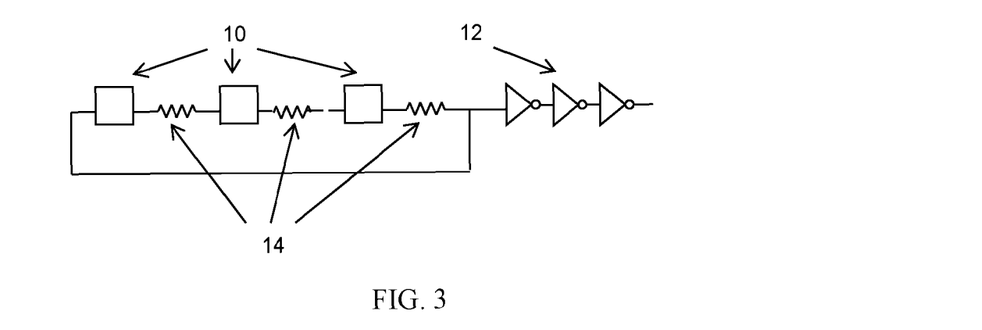
FIG. 3 is an equivalent circuit diagram of a simulation structure for a ring oscillator in an embodiment according to the present invention.
Figure 4:
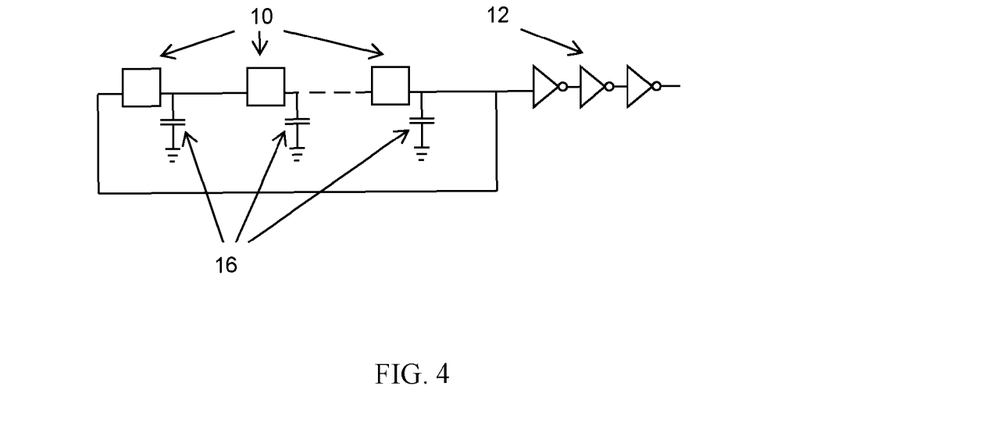
FIG. 4 is an equivalent circuit diagram of a simulation structure for a ring oscillator in another embodiment according to the present invention.

FIG. 3 is an equivalent circuit diagram illustrating a simulation structure for a ring oscillator in which an input port of each logical unit is connected with a parasitic resistance sub-structure in an embodiment according to the present invention. FIG. 4 is an equivalent circuit diagram illustrating a simulation structure for a ring oscillator in which an input port of each logical unit is connected with a parasitic capacitance sub-structure in another embodiment according to the present invention.

As shown in FIG. 3 and FIG. 4, the ring oscillator comprises a plurality of logical units 10. The number of the logical units is odd and is generally greater than or equal to 3. In the embodiment, at least one frequency divider 12 is connected to an output end of one of the logical units. However, in other embodiments, the frequency divider 12 can be omitted. The ring oscillator with three logical units is taken as an example in the following embodiments.

Referring to FIG. 3, three logical units 10 connected in head-to-tail series form a ring oscillator. The logical units can be selected from at least one of an inverter, a NAND gate, and a NOR gate. The simulation structure for the ring oscillator further comprises parasitic resistance sub-structures 14 each connected to a corresponding logical unit, for determining errors in extracting parasitic resistance of polysilicon interconnects and metal interconnects.

Referring to FIG. 4, three logical units 10 connected in head-to-tail series form a ring oscillator. The logical unit can be selected from at least one of an inverter, a NAND gate, and a NOR gate. The simulation structure for the ring oscillator further comprises parasitic capacitance sub-structures 16 each connected to a corresponding logical unit in parallel with one end connected to an input port of the corresponding logical unit and the other end to a reference voltage, for determining errors in extracting parasitic capacitance between the polysilicon interconnects and between the metal interconnects.

By adding these two kinds of sub-structures, that is, the parasitic resistance sub-structures 14 each connected to a corresponding logical unit in series (as shown in FIG. 3) and the parasitic capacitance sub-structures 16 each connected to a corresponding logical unit in parallel (as shown in FIG. 4), it can be determined whether the simulation errors are caused by BEOL parasitic extraction and which BEOL parasitic extraction produces the simulation errors, thus calibration measurements can be taken correspondingly. In the present invention, various parasitic resistance sub-structures and parasitic capacitance sub-structures are provided as follows.

First Embodiment

Figure 5:
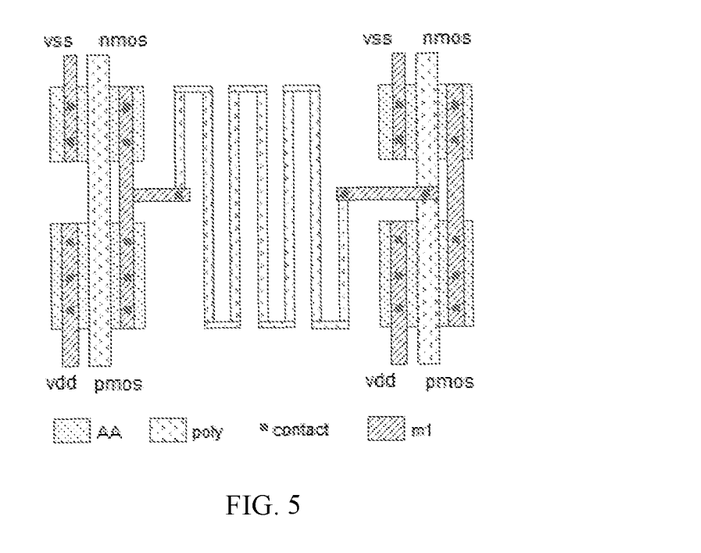
FIG. 5 is a top view of a parasitic resistance sub-structure in the structure for extracting interconnect parasitic in the ring oscillator in an embodiment according to the present invention.

FIG. 5 illustrates a parasitic resistance sub-structure according to the embodiment. Referring to FIG. 5, the parasitic resistance sub-structure is a polysilicon resistance cell having a serpentine shape connected between two adjacent logical units, for determining errors in extracting the parasitic resistance of the polysilicon interconnects.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. Two logical units are connected via the serpentine-shaped polysilicon resistance cell in the polysilicon gate layer.

Specifically, one end of the serpentine-shaped polysilicon resistance cell is connected to the output port of one logical unit through metal lines in the metal interconnect layer M1, the other end is connected to the input port of the other logical unit through metal lines in the metal interconnect layer M1. The metal lines in the metal interconnect layer M1 are connected to the output port and input port of the two adjacent logical units through contact holes in the contact hole layer. Preferably, a layer of metal silicide is covered on the polysilicon resistance cell.

Second Embodiment

Figure 6:
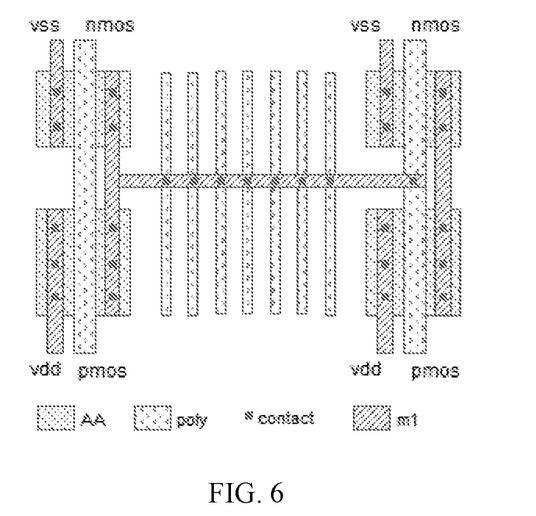
FIG. 6 is a top view of a parasitic capacitance sub-structure in the structure for extracting interconnect parasitic in the ring oscillator in another embodiment according to the present invention.

FIG. 6 illustrates a parasitic capacitance sub-structure according to the embodiment. Referring to FIG. 6, the parasitic capacitance sub-structure is a polysilicon capacitance cell having a comb shape with one end connected to an input port of a logical unit 10 and the other end connected to a reference voltage, for determining errors in extracting a polysilicon-to-substrate parasitic capacitance.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. Two logical units are connected through a metal line in the metal interconnect layer M1. The comb-shaped polysilicon capacitance cell in the polysilicon gate layer is also connected to the same metal line through contact holes in the contact hole layer.

Specifically, the output port of one logical unit is connected to the input of the other logical unit through the metal line in the metal interconnect layer M1. The comb-shaped polysilicon capacitance cell is also connected to the same metal line through the contact holes in the contact hole layer. Preferably, a layer of metal silicide is covered on the polysilicon capacitance cell.

Third Embodiment

Figure 7:
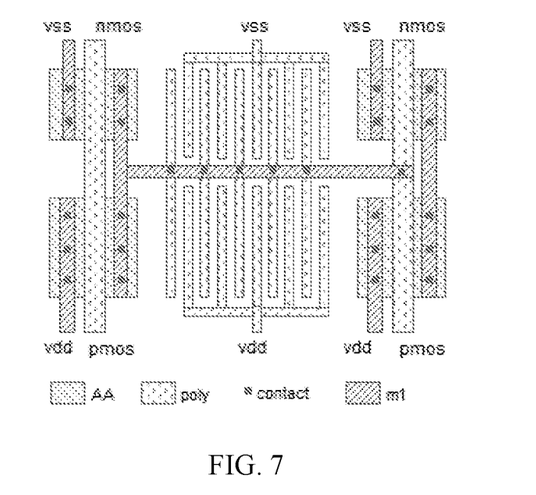
FIG. 7 is a top view of another parasitic capacitance sub-structure in the structure for extracting interconnect parasitic in the ring oscillator in another embodiment according to the present invention.

FIG. 7 illustrates a parasitic capacitance sub-structure according to the embodiment. Referring to FIG. 7, the parasitic capacitance sub-structure is an interdigitated polysilicon capacitance cell with one end connected to an input port of a logical unit 10 and the other end connected to a reference voltage, for determining errors in extracting parasitic capacitance between the polysilicon interconnects.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. Two logical units are connected through a metal line in the metal interconnect layer M1. The interdigitated polysilicon capacitance cell in the polysilicon gate layer is also connected to the same metal line through contact holes in the contact hole layer.

Specifically, the output port of one logical unit is connected to the input of the other logical unit through the metal line in the metal interconnect layer M1. The interdigitated polysilicon capacitance cell is also connected to the same metal line through the contact holes in the contact hole layer. Preferably, a layer of metal silicide is covered on the polysilicon capacitance cell.

Fourth Embodiment

Figure 8:
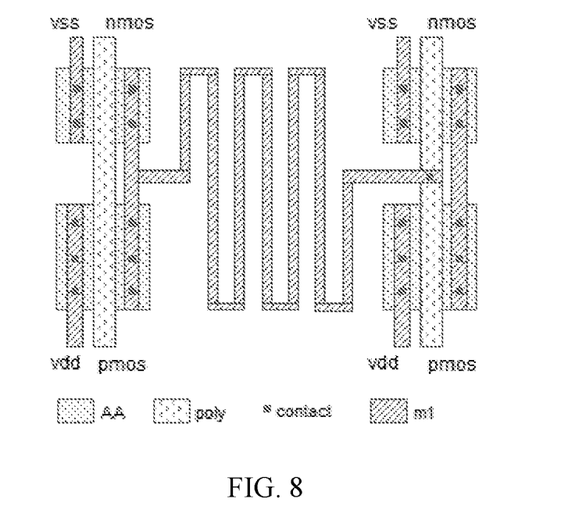
FIG. 8 is a top view of another parasitic resistance sub-structure in the structure for extracting interconnect parasitic in the ring oscillator in another embodiment according to the present invention.

FIG. 8 illustrates a parasitic resistance sub-structure according to the embodiment. Referring to FIG. 5, the parasitic resistance sub-structure is a metal resistance cell having a serpentine shape connected between two adjacent logical units, for determining errors in extracting the parasitic resistance of the metal interconnects. It is noted that, the serpentine-shaped metal resistance cell can be formed in any layer of multi-layer metal interconnects. The material of the metal interconnects can be Al, Cu or other metals. If the serpentine-shaped metal resistance cell is not formed in the metal interconnect layer M1, then it is connected to the metal lines in the metal interconnect layer M1 through contact holes in the contact hole layer.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. Two logical units are directly connected through the serpentine-shaped metal resistance cell in the metal interconnect layer M1.

Fifth Embodiment

Figure 9:
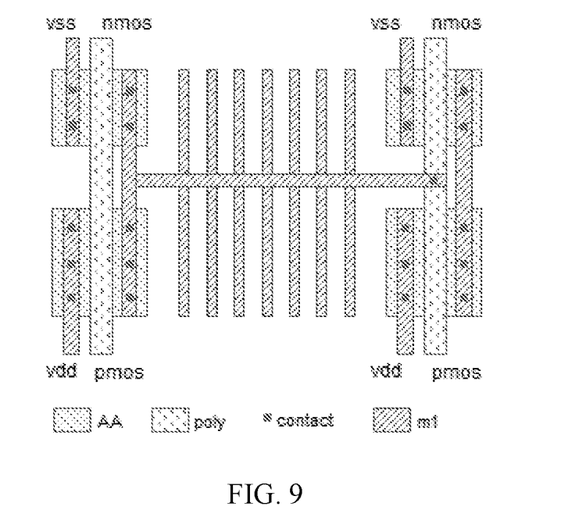
FIG. 9 is a top view of another parasitic capacitance sub-structure in the structure for extracting interconnect parasitic in the ring oscillator in another embodiment according to the present invention.

FIG. 9 illustrates a parasitic capacitance sub-structure according to the embodiment. Referring to FIG. 9, the parasitic capacitance sub-structure is a metal capacitance cell having a comb shape with one end connected to an input port of a logical unit 10 and the other end connected to a reference voltage, for determining errors in extracting a metal-to-substrate parasitic capacitance.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. Two logical units are connected through a metal line in the metal interconnect layer M1. The comb-shaped metal capacitance cell in the metal interconnect layer M1 is also connected to the same metal line.

It is noted that, the comb-shaped metal capacitance cell can be formed in any layer of multi-layer metal interconnects. The material of the metal interconnects can be Al, Cu or other metals. If the comb-shaped metal resistance cell is not formed in the metal interconnect layer M1, then it is connected to the metal line in the metal interconnect layer M1 through contact holes in the contact hole layer.

Sixth Embodiment

Figure 10:
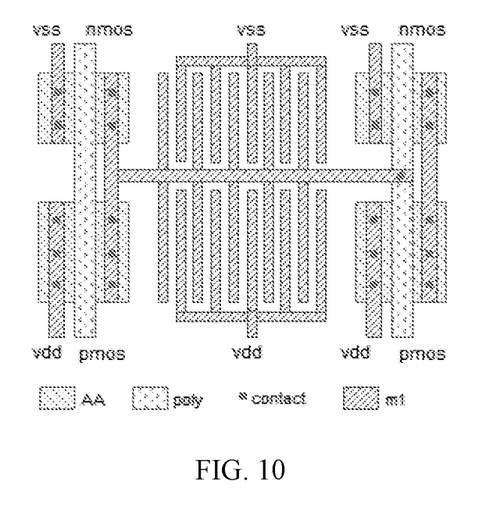
FIG. 10 is a top view of another parasitic capacitance sub-structure in the structure for extracting interconnect parasitic in the ring oscillator in another embodiment according to the present invention.

FIG. 10 illustrates a parasitic capacitance sub-structure according to the embodiment. Referring to FIG. 10, the parasitic capacitance sub-structure is an interdigitated metal capacitance cell with one end connected to an input port of a logical unit 10 and the other end connected to a reference voltage, for determining errors in extracting parasitic capacitance between the metal interconnects in the same layer.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a metal interconnect layer, "vss" refers to a ground voltage, "vdd" refers to a power supply voltage. Two logical units are directly connected through a metal line in the metal interconnect layer M1. The interdigitated metal capacitance cell in the metal interconnect layer M1 is also connected to the same metal line.

It is noted that, the interdigitated metal capacitance cell can be disposed in the same layer of the metal interconnect layer M1 or other metal interconnect layer. The anode and cathode of the interdigitated metal capacitance cell are both in the same layer. The material of the interdigitated metal capacitance cell can be Al, Cu, or other metals.

The output port of one logical unit is connected to the input of the other logical unit through the metal connection line in the metal interconnect layer M1. The interdigitated metal capacitance cell comprises two segment. Herein, one segment is connected to the same metal line in the metal interconnect layer M1 in a comb-like configuration, the other segment is connected to the ground vss or the power supply vdd.

Seventh Embodiment

Figure 11:
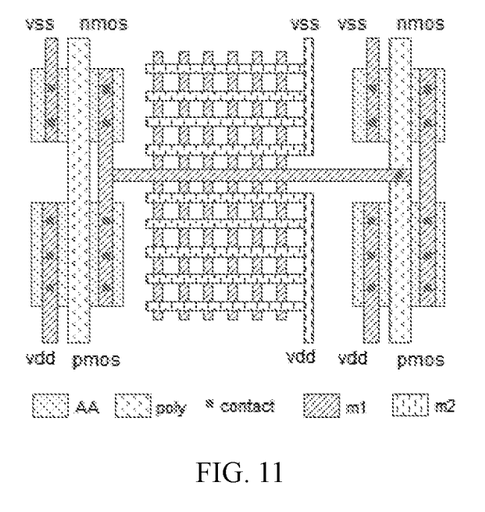
FIG. 11 is a top view of another parasitic capacitance sub-structure in the structure for extracting interconnect parasitic in the ring oscillator in another embodiment according to the present invention.

FIG. 11 illustrates a parasitic capacitance sub-structure according to the embodiment. Referring to FIG. 11, the parasitic capacitance sub-structure is a two-layer orthogonal metal capacitance cell with one end connected to an input port of a logical unit 10 and the other end connected to a reference voltage, for determining errors in extracting parasitic capacitance between the metal interconnects in two adjacent layers.

In the embodiment, each logical unit 10 comprises a PMOS transistor and a NMOS transistor. Herein, "AA" refers to an active area, "poly" refers to a polysilicon gate layer, "contact" refers to a contact hole layer, "M1" refers to a first metal interconnect layer, "M2" refers to a second metal interconnect layer, "vss" refers to a ground voltage, "vdd" refers to a power supply voltage.

In the embodiment, the two-layer orthogonal metal capacitance cell has two segments respectively in the first metal interconnect layer M1 and the second metal interconnect layer M2. One segment is an "anode" and the other a "cathode". In other embodiments, the two segments can be disposed in any two adjacent layers of the multi-layer metal interconnects except for the metal interconnect layer M1 and M2. The material of the metal interconnects can be Al, Cu, or other metals. If the two-layer orthogonal metal resistance cell is not formed in the metal interconnect layer M1, then one segment is connected to the metal lines in the metal interconnect layer M1 through contact holes in the contact hole layer.

The output port of one logical unit is connected to the input of the other logical unit through the metal line in the metal interconnect layer M1. The segment in the first metal layer M1 includes first metal lines extending from the metal connection line in a comb-like configuration. Each first metal line is connected to the metal line at one end with the other end suspended. The segment in the second metal layer M2 includes second metal lines extending orthogonal to the first metal lines. Each of the second metal lines is connected to the power supply or ground at one end and suspended at the other end.

In summary, according to the embodiments mentioned above, different parasitic resistance sub-structures and parasitic capacitance sub-structures are provided before each of the logical units in the simulation structure for the ring oscillator. By comparing the simulation results of the simulation structure having these sub-structures and the actual measurement results, it can be determined whether the simulation errors are caused by BEOL parasitic extraction and which parasitic extraction produces the simulation errors. Therefore, the simulation errors can be calibrated accordingly to obtain more precise circuit simulation results and more accurate device model and BEOL model, which greatly reduces the risks on circuit re-design.

The beneficial effects of the present invention will be described with reference to the following experimental data.

Please referring to Table 1, which illustrates the comparison of the measurement results and the simulation results of the ring oscillator without calibrating the errors in BEOL parasitic extraction.

| Simulation structure | RC delay measurement results (ps/stage) | RC delay simulation results (ps/stage) | Simulation error |
|---|---|---|---|
| Structure in FIG. 4 | 15.07 | 15.12 | 0.33% |
| Structure in FIG. 5 | 22.15 | 23.62 | 6.64% |
| Structure in FIG. 6 | 18.32 | 19.14 | 4.48% |
| Structure in FIG. 7 | 20.57 | 22.03 | 7.10% |
| Structure in FIG. 8 | 17.36 | 16.71 | −3.74% |
| Structure in FIG. 9 | 16.11 | 15.56 | −3.41% |
| Structure in FIG. 10 | 16.78 | 15.92 | −5.13% |
| Structure in FIG. 11 | 17.53 | 16.38 | −6.56% |

From above, it is known that due to the errors in parasitic extraction, the simulation error is large.

Please referring to Table 2, which illustrates the comparison of the measurement results and the simulation results of the ring oscillator after calibrating the errors in BEOL parasitic extraction.

| Simulation structure | RC delay measurement results (ps/stage) | RC delay simulation results (ps/stage) | Simulation error |
|---|---|---|---|
| Structure in FIG. 4 | 15.07 | 15.12 | 0.33% |
| Structure in FIG. 5 | 22.15 | 22.22 | 0.32% |
| Structure in FIG. 6 | 18.32 | 18.41 | 0.49% |
| Structure in FIG. 7 | 20.57 | 20.6 | 0.15% |
| Structure in FIG. 8 | 17.36 | 17.31 | −0.29% |
| Structure in FIG. 9 | 16.11 | 16.2 | 0.56% |
| Structure in FIG. 10 | 16.78 | 16.69 | −0.54% |
| Structure in FIG. 11 | 17.53 | 17.58 | 0.29% |

Since corresponding parasitic extraction error is calibrated based on the comparison between the original simulation results of the simulation structure and the actual measurement results, the re-simulation results shown in Table 2 is more accurate.

Although the present invention has been disclosed as above with respect to the preferred embodiment, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A structure for extracting interconnect parasitic in a ring oscillator circuit comprising N logical units connected in head to tail series to form a ring oscillator and at least one frequency divider, an input port of the frequency divider is connected to an output port of one of the logical units, wherein N is an odd number and is greater than or equal to 3; the structure comprises parasitic resistance sub-structures and/or parasitic capacitance sub-structures; wherein each of the parasitic resistance sub-structures is connected to metal lines in a metal interconnect layer between a corresponding logical unit and its adjacent logical unit for determining errors in extracting parasitic resistance of polysilicon interconnects or metal interconnects; wherein each of the parasitic capacitance sub-structures is connected to a corresponding logical unit in parallel with one end connected to an input port of the corresponding logical unit through the metal lines in the metal interconnect layer and the other end to a reference voltage, for determining errors in extracting parasitic capacitance in relation to the polysilicon interconnects or the metal interconnects; wherein a parasitic extraction error is determined by comparing RC delay simulation results of the ring oscillator circuit having the structure with its actual RC delay measurement results.

2. The structure according to claim 1, wherein the logical units are selected from at least one of an inverter, a NAND gate, and a NOR gate.

3. The structure according to claim 1, wherein the parasitic resistance sub-structure is a polysilicon resistance cell having a serpentine shape connected between two adjacent logical units for determining errors in extracting the parasitic resistance of the polysilicon interconnects; wherein between two adjacent logical units, one end of the serpentine-shaped polysilicon resistance cell is connected to an output port of one logical unit through the metal lines in the metal interconnect layer, the other end is connected to the input port of the other logical unit through the metal lines in the same metal interconnect layer.

4. The structure according to claim 1, wherein the parasitic capacitance sub-structure is a polysilicon capacitance cell having a comb shape with one end connected to the input port of the corresponding logical unit and the other end connected to the reference voltage for determining errors in extracting a polysilicon-to-substrate parasitic capacitance; wherein two adjacent logical units are connected through the metal lines in the metal interconnect layer, the comb-shaped polysilicon capacitance cell is also connected to the same metal lines.

5. The structure according to claim 1, wherein the parasitic capacitance sub-structure is an interdigitated polysilicon capacitance cell with one end connected to the input port of the corresponding logical unit and the other end connected to the reference voltage for determining errors in extracting the parasitic capacitance between the polysilicon interconnects; wherein two adjacent logical units are connected through the metal lines in the metal interconnect layer, the interdigitated polysilicon capacitance cell is also connected to the same metal lines.

6. The structure according to claim 1, wherein the parasitic resistance sub-structure is a metal resistance cell having a serpentine shape connected between two adjacent logical units for determining errors in extracting the parasitic resistance of the metal interconnects; wherein the metal resistance cell is disposed in any layer of multi-layer metal interconnects.

7. The structure according to claim 1, wherein the parasitic capacitance sub-structure is a metal capacitance cell having a comb shape with one end connected to the input port of the corresponding logical unit and the other end connected to the reference voltage for determining errors in extracting a metal-to-substrate parasitic capacitance; wherein two adjacent logical units are connected through the metal lines in the metal interconnect layer, the comb-shaped metal capacitance cell is also connected to the same metal lines.

8. The structure according to claim 7, wherein the metal capacitance cell having a comb shape is disposed in any layer or any multiple layers of multi-layer metal interconnects.

9. The structure according to claim 1, wherein the parasitic capacitance sub-structure is an interdigitated metal capacitance cell with one end connected to the input port of the corresponding logical unit and the other end connected to the reference voltage for determining errors in extracting the parasitic capacitance between the metal interconnects in the same metal layer; wherein two adjacent logical units are directly connected through the metal lines in the metal interconnect layer, the interdigitated metal capacitance cell is also connected to the same metal lines; wherein an anode and a cathode of the interdigitated metal capacitance cell are in the same metal interconnect layer.

10. The structure according to claim 9, wherein the interdigitated metal capacitance cell is disposed in any layer of multi-layer metal interconnects.

11. The structure according to claim 1, wherein the parasitic capacitance sub-structure is a two-layer orthogonal metal capacitance cell in two adjacent metal layers with one end connected to the input port of the corresponding logical unit and the other end connected to the reference voltage for determining errors in extracting the parasitic capacitance between the metal interconnects in adjacent metal layers; wherein an anode and a cathode of the two-layer orthogonal metal capacitance cell are disposed in two adjacent layers of the multi-layer metal interconnects.

12. The structure according to claim 3, wherein a metal silicide layer is covered on the polysilicon resistance cell.

13. The structure according to claim 4, wherein a metal silicide layer is covered on the polysilicon capacitance cell.

14. The structure according to claim 5, wherein a metal silicide layer is covered on the polysilicon capacitance cell.

* * * * *